United States Patent [19]

Yoshizawa et al.

[11] Patent Number: 5,521,520

[45] Date of Patent: May 28, 1996

[54] METHOD AND APPARATUS FOR CHECKING PARTS TO BE MEASURED USING A BELT-LIKE CONNECTION MEMBER

[75] Inventors: Tetsuo Yoshizawa, Yokohama; Toyohide Miyazaki, Ibaraki-ken; Hiroshi Kondo, Osaka; Takashi Sakaki, Tokyo; Yoshimi Terayama, Odawara; Yasuteru Ichida, Machida, all of Japan

[73] Assignee: Canon Kabushiki Kaisha, Tokyo, Japan

[21] Appl. No.: 378,933

[22] Filed: Jan. 26, 1995

Related U.S. Application Data

[63] Continuation of Ser. No. 171,855, Dec. 22, 1993, abandoned, which is a continuation of Ser. No. 734,956, Jul. 24, 1991, abandoned.

[30] Foreign Application Priority Data

Jul. 25, 1990 [JP] Japan .................................. 2-198860

[51] Int. Cl.⁶ ...................................................... G01R 1/02
[52] U.S. Cl. ............................................................ 324/754
[58] Field of Search ...................................... 324/754, 765, 324/72.5, 500, 537; 437/8; 439/482; 29/852; 364/550, 551.01

[56] References Cited

U.S. PATENT DOCUMENTS

| 5,012,187 | 4/1991 | Littlebury | 324/158 P |
|---|---|---|---|
| 5,027,062 | 6/1991 | Dugan et al. | 324/158 P |
| 5,055,776 | 10/1991 | Miller et al. | 324/158 F |
| 5,189,363 | 2/1993 | Bregman et al. | 324/158 F |

FOREIGN PATENT DOCUMENTS

| 0355273 | 2/1990 | European Pat. Off. . | |
|---|---|---|---|
| 0291167 | 11/1989 | Japan | 324/158 P |
| 1302172 | 12/1989 | Japan . | |
| 2189657 | 10/1987 | United Kingdom . | |
| 2239744 | 10/1991 | United Kingdom . | |

*Primary Examiner*—Vinh P. Nguyen
*Attorney, Agent, or Firm*—Fitzpatrick, Cella, Harper & Scinto

[57] ABSTRACT

A method for checking a part to be measured, by using an electric connection member having a holder made of electrically insulative material and a plurality of electrically conductive members embedded within the holder with being insulated from each other, both ends of the electrically conductive members being exposed on both surfaces of the holder in such a manner that the both ends are flush with or protruded from the both surfaces of the holder; an electric circuit member having connection portions; and a measured part having connection portions. At least one of the ends of the electrically conductive members exposed on one surface of the holder is electrically connected to one of the connection portions of the electric circuit member and at least one of the ends of the electrically conductive members exposed on the other surface of the holder is electrically connected to one of the connection portions of the measured part. The electric feature and/or system feature of the measured part are measured by using the electric circuit member. The measurements are effected by repeatedly using the same electrically conductive member contributing to the electrical connection for the electric connection member, by plural times.

15 Claims, 7 Drawing Sheets

METHOD AND APPARATUS FOR CHECKING PARTS TO BE MEASURED USING A BELT-LIKE CONNECTION MEMBER

This application is a continuation of application Ser. No. 08/171,855 filed Dec. 22, 1993, now abandoned, which is a continuation of application Ser. No. 07/734,956 filed Jul. 24, 1991, abandoned.

BACKGROUND OF THE INVENTION

1. Field of the Invention

The present invention relates to a method for checking a part to be measured (measured part) to measure the electric feature and/or system feature thereof by using an electric connection member.

2. Related Background Art

In the past, as electrical checking methods for measuring the electric feature of parts to be measured, such as semi-conductor elements, semi-conductor parts, printed boards of resin, metal or ceramics, silicone substrates or lead frames, a method using probe cards and a method using contact springs are well-known. However, in these methods, since a minimum pitch required for preventing the contact between adjacent probes was relatively large, there arose a problem that such methods could not be utilized if a small pitch between connection portions of the part to be measured was required. Further, such methods give rise to an electrical problem that the resistance value and accordingly the stray capacity were increased due to the increase in the wiring length. Particularly, in the electrical measuring of a high frequency electric circuit, such an electrical problem was serious.

In order to solve the above problems, methods for measuring the electric features of parts to be measured, by using an electric connection member wherein a plurality of conductive members are electrically isolated from each other in an insulation holder or by using an electric connection member wherein conductive members are disposed in and/or on an insulation holder and both ends of the conductive members are exposed on both surfaces of the insulation holder with being flush with or protruding from the surfaces of the holder have been proposed, as described in the Japanese Patent Application Laid-Open Nos. 1-291167 and 1-291168. An example of such probe cards is shown in FIGS. 8A to 8C.

FIG. 8A is a perspective view of a probe card which has already proposed, where an electric connection member 125 and a circuit board (electric circuit member) 104 are illustrated as being separated from each other, for clarifying this Figure. In a completed condition, as shown in FIG. 8B, the electric connection member 125 and the circuit board 104 are integrally coupled to each other to form a probe card 200.

In the probe card 200 regarding this example, the electric connection member 125 comprises a holder 111 made of electrically insulative organic material, and metallic members (electrically conductive members) 107 embedded in the holder 111. One end of each metallic member 107 is exposed on one surface of the holder 111 and the other end is exposed on the other surface of the holder. Further, the circuit board 104 has connection portions 102 to which one ends of the metallic members 107 exposed on one surface of the holer 111 are connected by brazing.

Next, a method for measuring the electric feature of the measured part by using the probe card 200 so constructed will be explained with reference to FIG. 8C.

In this example, a semi-conductor element 101 is used as the measured part. The semi-conductor element 101 has connection portions 105 arranged at a pitch of 40 μm. First of all, the connection portions (made of tungsten in this example) 109 of the electric connection member 125 are positioned to face the connection portions (made of aluminium in this example) 105 of the semi-conductor element 101, and then, these connection portions 109, 105 are electrically connected to each other (FIG. 8C), thus performing the measurement of the electric feature of the semi-conductor element. Incidentally, the electrical connection between these connection portions is not permanent but temporary, and, thus, these connection portions can be disconnected from each other after the measuring operation.

By the way, the inventors and the like has proposed a method for manufacturing the electric connection member as shown in FIG. 9 (Japanese Patent Application Laid-open No. 2-49385).

According to such method, first of all, a photosensitive resin layer 35a acting as a holder 35 is coated on a conductive copper foil 40 (FIG. 9A). Then, by exposing and developing predetermined portions (into which electrically conductive members 34 are embedded in later process) of the photosensitive resin layer, holes 35b are formed in the resin layer 35a to expose the copper foil 40, and then the photosensitive resin layer 35a is cured by heating it (FIG. 9B). Then, portions of the copper foil 40 around the holes 35b are etched to form recesses 41 below the holes 35b (FIG. 9C).

Thereafter, by electroplating the copper foil 40 with gold or the like, the recesses 41 and the holes 35b are filled with the conductive members 34 to form bumps 39 in the recesses 41 and bumps 38 on an upper surface of the photosensitive resin layer 35a (FIG. 9D). Thereafter, by removing the copper foil 40 by the metal etching technique, the electric connection member 1 is completed (FIG. 9E).

However, in this conventional method, it is relatively difficult to control projecting amounts of the electrically conductive members of the electric connection member. Accordingly, since there was always the slight dispersion in the projecting amounts of the conductive members, there arose the dispersion in the repeated numbers of the measurements (service lives) of the electric connection members, thus not permitting the stable electrical check of the measured part.

Further, since the electrically conductive members of the electric connection member are connected to the connection portions of the circuit board, if electrically conductive members of the measured part are worn, the electric connection member must be replaced or both the electric connection member and the circuit board (i.e., probe card) must be replaced. Thus, in the former case, if the replacements must be effected frequently, a problem in quality will arise, and, in the latter case, a problem in cost will arise.

In addition, when various kinds of measured parts are measured, in the conventional methods, since the electric connection member and the circuit board (i.e., probe card) must be changed on all such occasions, the conventional methods were not of practical use.

SUMMARY OF THE INVENTION

The present invention aims to eliminate the above-mentioned conventional drawbacks, and an object of the present invention is to provide a unique method for checking a part to be measured. That is to say, the object of the present invention is to provide a method for checking a measured part, which can easily perform the measurements of multi-pin parts to be measured, with a narrow pitch, by repeatedly using new electrically conductive members of an electric connection member if the electrically conductive members are worn (i.e., by using an electric connection member of disposable type in a sense), and which is reliable and inexpensive.

In order to achieve the above object, the present invention provides a method for checking a part to be measured, by using an electric connection member having a holder made of electrically insulative material and a plurality of electrically conductive members embedded within the holder with being insulated from each other, both ends of the electrically conductive members being exposed on both surfaces of the holder in such a manner that the both ends are flush with or protruded from the both surfaces of the holder; an electric circuit member having connection portions; and a measured part having connection portions. Wherein at least one of the ends of the electrically conductive members exposed on one surface of the holder is electrically connected to one of the connection portions of the electric circuit member and at least one of the ends of the electrically conductive members exposed on the other surface of the holder is electrically connected to one of the connection portions of the measured part, whereby the electric feature and/or system feature of the measured part are measured by using the electric circuit member, and wherein the measurements are effected by repeatedly using the same electrically conductive member contributing to the electrical connection for the electric connection member, by plural times.

According to one aspect of the present invention, the method for checking the measured part can measure the electric feature and/or system feature of the measured part by repeatedly using the same electrically conductive member or members contributing the electrical connection between the electric connection member and N (in number) measured parts plural times P up to the service time (N≦P). In this case, it is possible not only to check the measured parts with a narrow pitch but also to easily replace only the electric connection member by a new one if dispersion in the protruding amounts of the electrically conductive members occurs, thereby permitting qualitatively stable measurements and making the checking method inexpensive.

Further, when the various kinds of measured parts are checked, there will be the following two cases; that is, a case where only the circuit board must be changed but the electric connection member may not be changed and a case where both the circuit board and the electric connection member must be changed. According to the present invention, in both cases, the circuit board or/and the electric connection member can easily be changed, thus obtaining a practical checking method.

According to another aspect of the present invention, there is provided a checking method for checking a measured part, wherein the electric connection member is in the form of roll and desired electrically conductive members of the electric connection member contributing to the electrical connection are repeatedly connected to $n_1$ (in number) measured parts by A times up to their service lives ($n_1 \leq A$) to measure the electric feature and/or system feature of the measured parts, and then other desired electrically conductive members of the roll-shaped electric connection member are repeatedly connected to $n_2$ (in number) measured parts B times up to their service lives ($n_2 \leq B$) to measure the electric feature and/or system feature of such measured parts. In this way, by repeatedly using various electrically conductive members of the roll-shaped electric connection member, $n_1+n_2+\ldots$ (in number) measured parts are checked by the same electric connection member in one roll.

In this case, it is possible to check the measured parts more easily than the checking method according to the aforementioned aspect of the invention and to perform the checking of the multi-pin measured parts with the narrow pitch cheaply and reliably.

According to a further aspect of the present invention, a checking method wherein at least one physical vibration is applied to the measured parts before they are connected to the electric connection member or during the connection between the measured parts and the electric connection member is proposed.

This method is particularly effective when it is difficult to obtain the adequate electrical connection due to the oxidized film, dirt and the like disposed on the connection portions.

The present invention is applicable to the checking of the electric feature and/or system feature of the wiring arranged on a multi-pin measured part such as a camera housing (having the wiring thereon), office equipment, household electric equipment, measuring equipments before the wiring of the housing is connected to the electric circuit member, the electric feature of a transformer coil before it is connected to the electric circuit member, the electric feature and/or system feature of a printing part such as a thermal ink jet head, thermal head and the like and of the printing system using such printing part and of an LED array, contact sensor and liquid crystal part and of the system using such part before they are connected to the electric circuit member, and the electric feature and/or system feature of other parts before they are connected to the electric circuit member. The present invention is particularly effective in the above-mentioned checking.

The larger the number of pins of the measured part and the narrower the pitch between the pins of the measured part, the greater the effectiveness of the present invention. Further, the present invention is also effective for elongated parts to be measured.

BRIEF DESCRIPTION OF THE DRAWINGS

FIG. 1A is a sectional view of various elements before they are electrically connected to each other and FIG. 1B is a sectional view of such elements after they are electrically connected to each other;

FIG. 3A is a sectional view of various elements before they are electrically connected to each other and FIG. 3B is a sectional view of such elements after they are electrically connected to each other;

DETAILED DESCRIPTION OF THE PREFERRED EMBODIMENTS

The present invention will now be explained in connection with embodiments thereof with reference to the accompanying drawings.

First of all, a first embodiment of the present invention will be described.

Figure 1A:
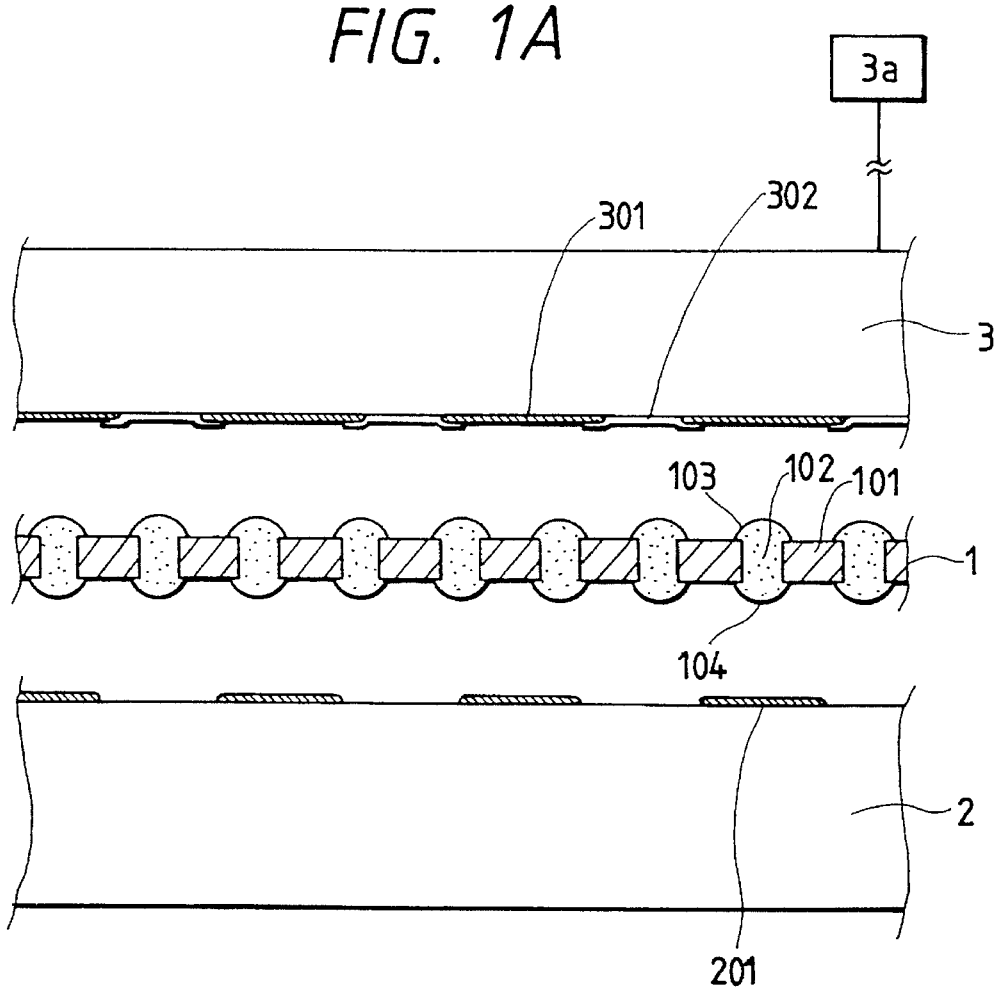
FIGS. 1A and 1B show a preferred embodiment of the present invention, where
Figure 1B:
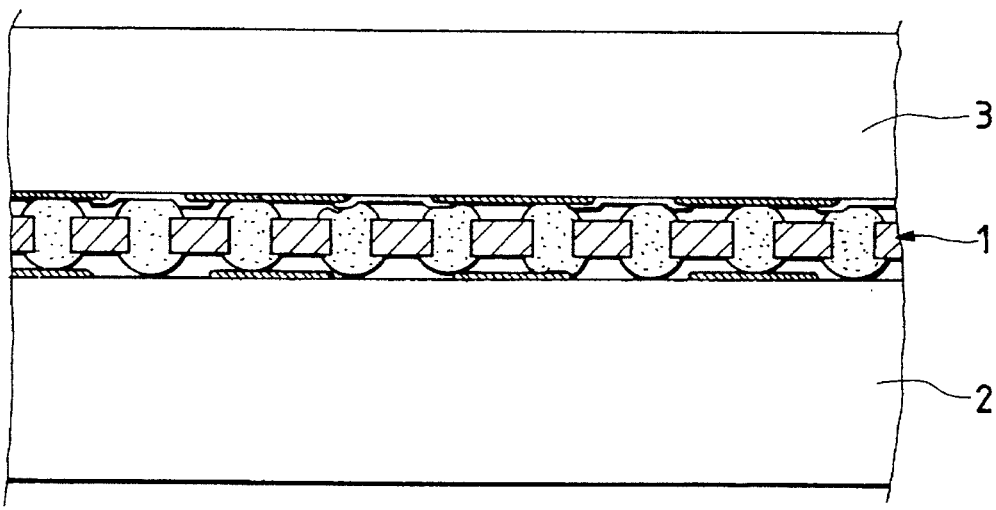

FIG. 1A and 1B are schematic sectional views showing a condition in which a measured part (part to be measured) and an electric circuit member are being electrically connected to each other via an electric connection member, where FIG. 1A shows a condition before these elements are interconnected, and FIG. 1B shows a condition after these elements are interconnected.

In FIGS. 1A and 1B, the reference numeral 1 denotes an electric connection member; 2 denotes an electric circuit member; and 3 denotes a semi-conductor element as a measured part. The electric connection member can be manufactured in the same manner as the above-mentioned conventional method. This method for manufacturing the electric connection member used in the first embodiment will be fully described with reference to FIG. 9.

Figure 9A:
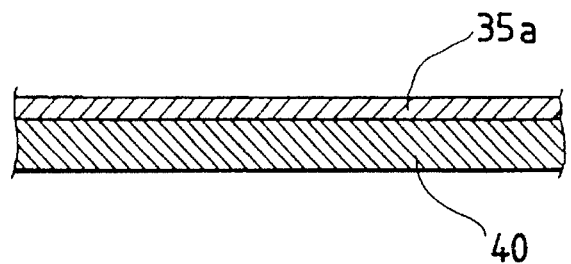
FIGS. 9A to 9E are sectional views showing processes for manufacturing an electric connection member.
Figure 9B:
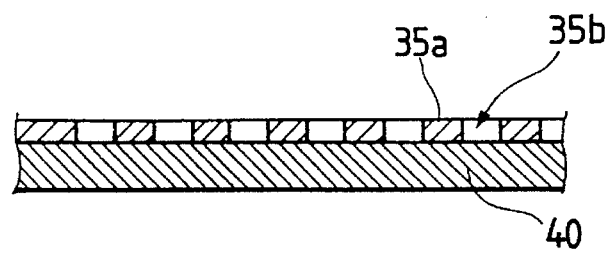

First of all, a copper plate 40 as a substrate is prepared, and then, the adhesion aiding agent is coated on the copper plate 40 by a spinner. Then, after polyimide resin 35a as photosensitive resin of negative type is coated on the copper plate 40 by the spinner, the copper plate is pre-baked (FIG. 9A). A thickness of the polyimide resin layer 35a is so selected that it becomes slightly greater than a desired thickness of a holder to be manufactured, in consideration of the scattering of the solvent and/or the reduction in the thickness of the resin layer due to the curing thereof. Then, after light is illuminated (exposed) onto the polyimide resin layer 35a through a photomask having a predetermined pattern, development is effected. In this case, the energy density of the light to be illuminated is set to have a value of 100–10,000 mj/cm$^2$ and the developing time is selected to be 4–30 minutes. In the illustrated embodiment, the polyimide resin 35a remains on the exposed portions and the polyimide 35a is removed from the non-exposed portions due to the development treatment to form holes 35b having a diameter of about 10–20 μm. Thereafter, heat is applied to cure the polyimide resin layer 35a.

By the way, even when the proper exposure condition and development condition is set, the residual matters (not shown) of the polyimide resin 35a often remain on the surface portions of the copper plate 40 in the holes 35b. In such a case, by performing the dry etching, the surface of the copper plate 40 is completely exposed.

The dry etching may be $O_2$ plasma etching, and an example of the etching condition is as follows: that is, high frequency electric power is 200–400 W, $O_2$ flow rate is 200 SCCM, etching pressure is 1 Torr and etching time is 5–10 minutes.

Figure 9C:
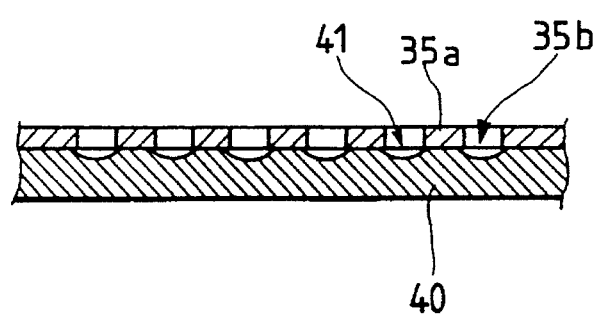

Next, the etching is effected by immersing the copper plate 40 so treated into the etching liquid. A portion of the copper plate 40 near each hole 35b is removed by the etching operation, thus forming corresponding recess 41 communicated to each hole 35b (FIG. 9C).

Figure 9D:
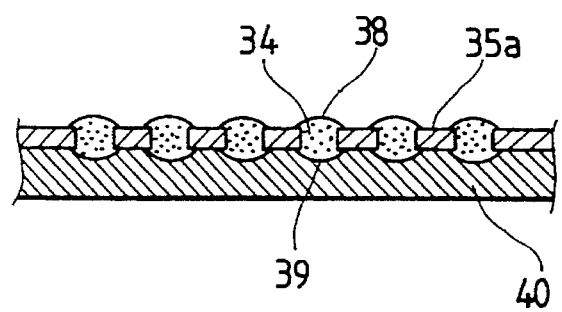
Figure 9E:
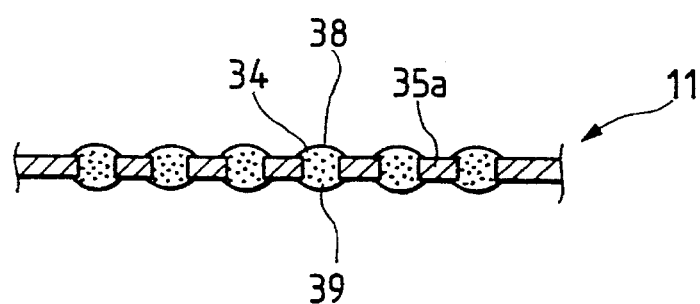

Then, the recesses 41 and the holes 35b are filled with gold 34 as conductive members by electroplating with the copper plate 40 as common electrode in such a manner that the gold is protruded above the upper surface of the polyimide resin layer 35a (FIG. 9D). At last, by performing the etching operation wherein copper is removed but gold is not removed, the copper plate 40 is removed, thus obtaining an electric connection member 1 as shown in FIG. 9E. In the electric connection member 1 so manufactured, the conductive material 34 is made of gold and the holder 35a is made of polyimide resin.

The dry etching may be electronic cycrotron resonance (ECR) plasma etching or laser etching using excimer laser light, as well as the above-mentioned $O_2$ plasma etching.

Incidentally, in the above-mentioned process, while all of the copper plate 40 was removed by the metal etching, the copper disposed positions other than where the gold remains may not be removed to reinforce the holder. Further, while the recesses and the holes were filled with gold by the gold electroplating, they may be filled with gold by other methods, for example, deposition technique.

In the illustrated embodiment, while the gold was used as the conductive member, metal such as Cu, Ag, Be, Ca, Mg, Mo, Ni, W, Fe, Ti, In, Ta, Zn, Al, Sn, Pb—Sn and the like or alloy thereof may be used, as well as the gold (Au). The conductive member may be made of a kind of metal or alloy thereof, or may be obtained by mixing a plurality of metals or alloy thereof. Alternatively, the conductive member may be obtained by mixing metallic material with organic and/or inorganic material. Incidentally, although the cross-section of the conductive member can be circular, rectangular or the like, the cross-section having no sharp corner is preferable to avoid the excessive concentration of stress. Further, it is not necessary to arrange the conductive members vertically in the holder 35, but the conductive members may be inclined from one surface of the holder to the other surface thereof.

In the illustrated embodiment, while polyimide resin was used as the photosensitive resin, the photosensitive resin is not limited to the polyimide resin. Further, one or more of inorganic material, metallic material and alloy material having a desired shape such as a powder shape, fiber shape, plate shape, rod shape or ball shape may be dispersed in the photosensitive resin. Such metallic material and alloy material may be Au, Ag, Cu, Al, Be, Ca, Mg, Mo, Fe, Ni, Co, Mn, W, Cr, Nb, Zr, Ti, Ta, Zn, Sn, Pb—Sn or the like. Further, such inorganic material may be ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$ and the like, diamond, glass, carbon boron or the like.

In the illustrated embodiment, while the copper plate was used, it is not limited to the copper plate. For example, a thin metallic or alloy plate made of Au, Ag, Be, Ca, Mg, Mo, Ni, W, Fe, In, Ta, Zn, Al, Sn, Pb—Sn or the like. However, since only the substrate is selectively removed by the etching in the last process, it is necessary to differentiate the material of the conductive member from the material of the substrate.

In the illustrated embodiment, while the holes were formed by the photo-lithography, such holes may be formed by high energy rays, such as excimer laser beams. In this case, it is not necessary to use the photosensitive resin. Further, by illuminating the excimer laser onto the surface of the resin, the holes may be formed in the resin and at the same time the recesses may be formed in the copper plate.

Returning to FIGS. 1A and 1B, a plurality of conductive members 102 made of gold embedded into the holder 101 made of polyimide resin are electrically insulated from each other and have one end 103 thereof exposed toward the semi-conductor element (measured part) 3 and the other end 104 thereof exposed toward the circuit board (electric circuit member) 2 (FIG. 1A).

Then, connection portions (made of Al) 301 of the semi-conductor element 3 which are not covered by a passivation film 302 are electrically connected to the conductive members (made of Au) 103 which are exposed toward the semi-conductor element 3, and connection portions 201 of the circuit board 2 which are gold-electroplated with Cu pattern are electrically connected to the conductive members (made of Au) which are exposed toward the circuit board 2, whereby the electric feature of the measured part is measured by using the electric circuit member 2 (FIG. 1B).

Then, the electric feature of another measured part is measured in the same manner as that described above, by performing the electrical connection by means of the same conductive members of the electric connection member.

In this way, while the electric features of 50 or more measured parts of same kind were measured by using the same conductive members of the electric connection member, there was no abnormality in the electric connection member, and, thus, it was possible to electrically check the parts effectively.

The service life of the electric connection member may be determined by previously testing such member to determine the usable times, or by measuring the measured parts by means of the same electric connection member by X times until the abnormity occurs, or by estimating it on the basis of fuzzy inference or probability after n samples were tested.

Incidentally, when the electrical connection is effected, although it is necessary to position the semi-conductor element 3 and the circuit board 2, since the pitch between the conductive members 102 of the electric connection member 1 is smaller than the pitch between the connection portions 301 of the semi-conductor element 3 and the pitch between the connection portion 201 of the circuit board 2, the positioning of the electric connection member 1 may be effected roughly.

Incidentally, in this embodiment, while the electric connection member 1 was connected to the circuit board 2 after it was connected to the semi-conductor element 3, it may be connected in the reverse manner. The electrical connection may be effected by using any known method such as abutment.

According to this embodiment, it was possible to check the measured part and the system utilizing such part quickly, cheaply and reliably.

Next, a second embodiment of the present invention will be explained with reference to FIGS. 1A and 1B.

In this second embodiment, after the both ends (surfaces) of the electrically conductive members 102 of the electric connection member 1 are electrically connected to the parts 2 and 3, a high frequency vibration is physically applied to the measured part 3 by using a vibration applying means 3a, and then the electric feature of the measured part 3 is measured. Other steps or processes are the same as those of the first embodiment.

In the second embodiment, although the number of measured parts which can be checked by the same conductive members of the electric connection member (i.e., service life of the conductive members) was slightly reduced, the reliability of the electrical connection regarding each measured part was improved. Also in this embodiment, it was possible to check the measured part and the system utilizing such part quickly, cheaply and reliably.

In this embodiment, while the vibration was applied to the measured part along a main plane of the measured part, the vibration may be applied to the electric connection member 1 or the electric circuit member 2 or the vibration may be applied to the measure part in a direction perpendicular to the main plane thereof.

Figure 2:
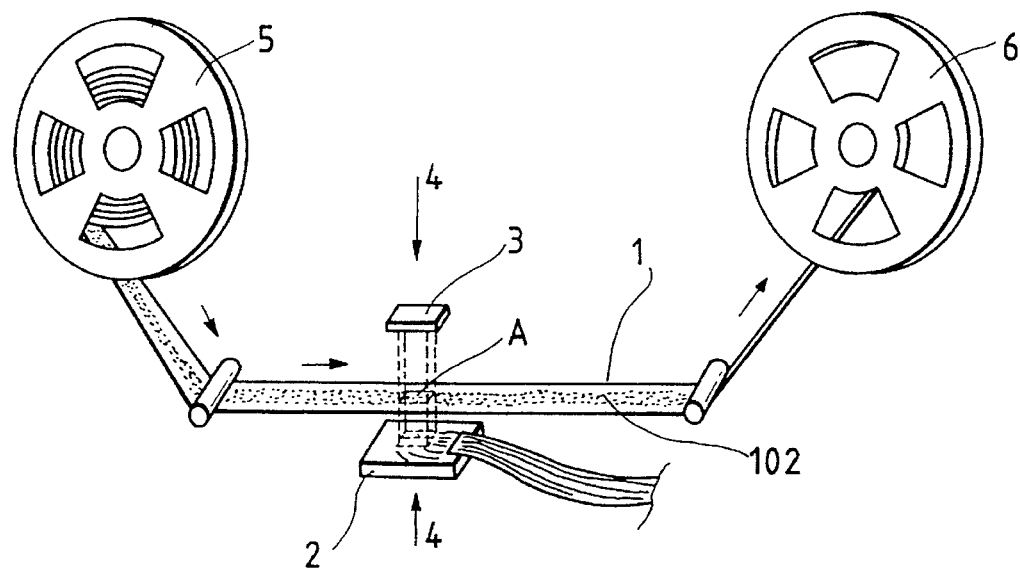
FIG. 2 is a perspective view of various elements of FIG. 1 before they are electrically connected to each other.

Next, a third embodiment of the present invention is shown in FIG. 2.

In FIG. 2, the reference numeral 1 denotes an electric connection member comprising a continuous strip in the form of roll; 2 denotes an electric circuit member; and 3 denotes a measured part.

This embodiment is the same as the first embodiment, except the shape of the electric connection member. That is to say, in this third embodiment, the electric connection member 1 is wound around a reel 5, and a used-up portion of the electric connection member is wound on a reel 6.

The electrically conductive members 102 of the electric connection member 1 are arranged on the holder with protruding therefrom to provide a desired continuous pattern, and the electrically conductive members included in a desired range A are repeatedly used to electrically check a plurality of measured parts until their service lives are expired. Then, the roll is unwound by a predetermined amount to bring the conductive members included in a next desired range B to a checking position. Thereafter, the conductive members in the range B are used to electrically check a plurality of measured parts until their service lives are expired. By repeating these operations, the electric features of many measured parts can be electrically checked.

In this embodiment, by urging the parts 2, 3 in directions shown by the arrow 4, the connection portions of the measured part are electrically connected to the electrically conductive members of the electric connection member and the connection portions of the electric circuit member are electrically connected to the electrically conductive members.

Also in this embodiment, it was possible to check the measured part and the system utilizing such part quickly, cheaply and reliably.

Figure 3A:
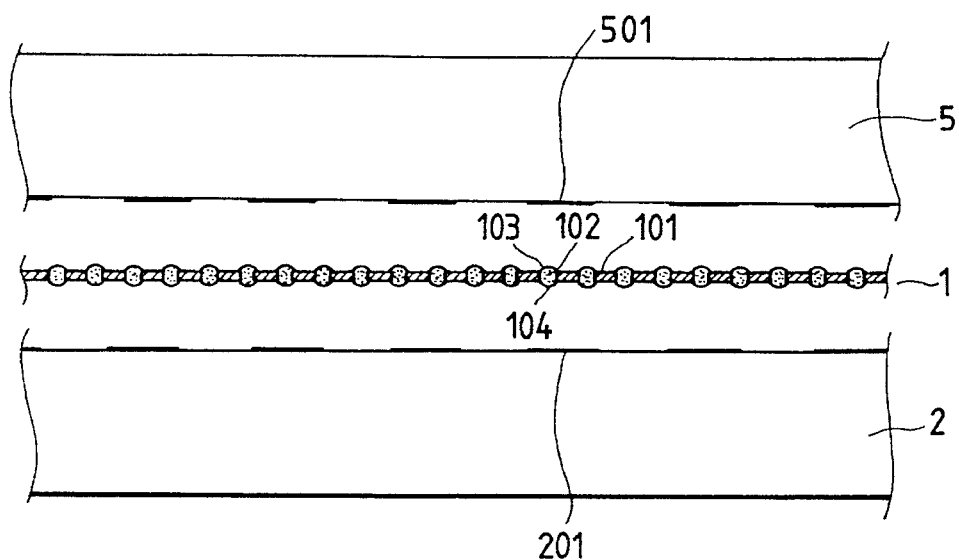
FIGS. 3A and 3B show another embodiment of the present invention, where
Figure 3B:
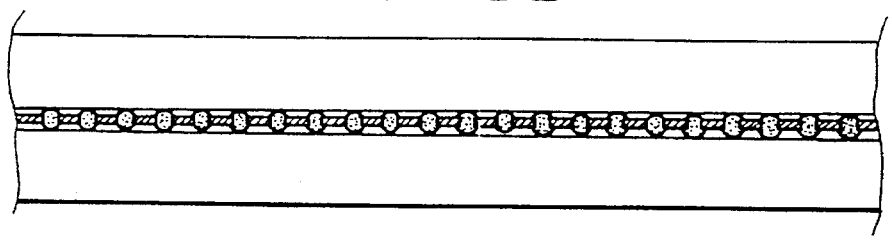

FIGS. 3A and 3B show a fourth embodiment of the present invention. This embodiment is the same as the first embodiment, except that a measured part comprises a circuit board 5.

According to this embodiment, it was possible to electrically measure 100 or more circuit boards 5 by using the same conductive members included in a desired range. Further, it was possible to check the measured part and the system utilizing such part quickly, cheaply and reliably.

Figure 4:
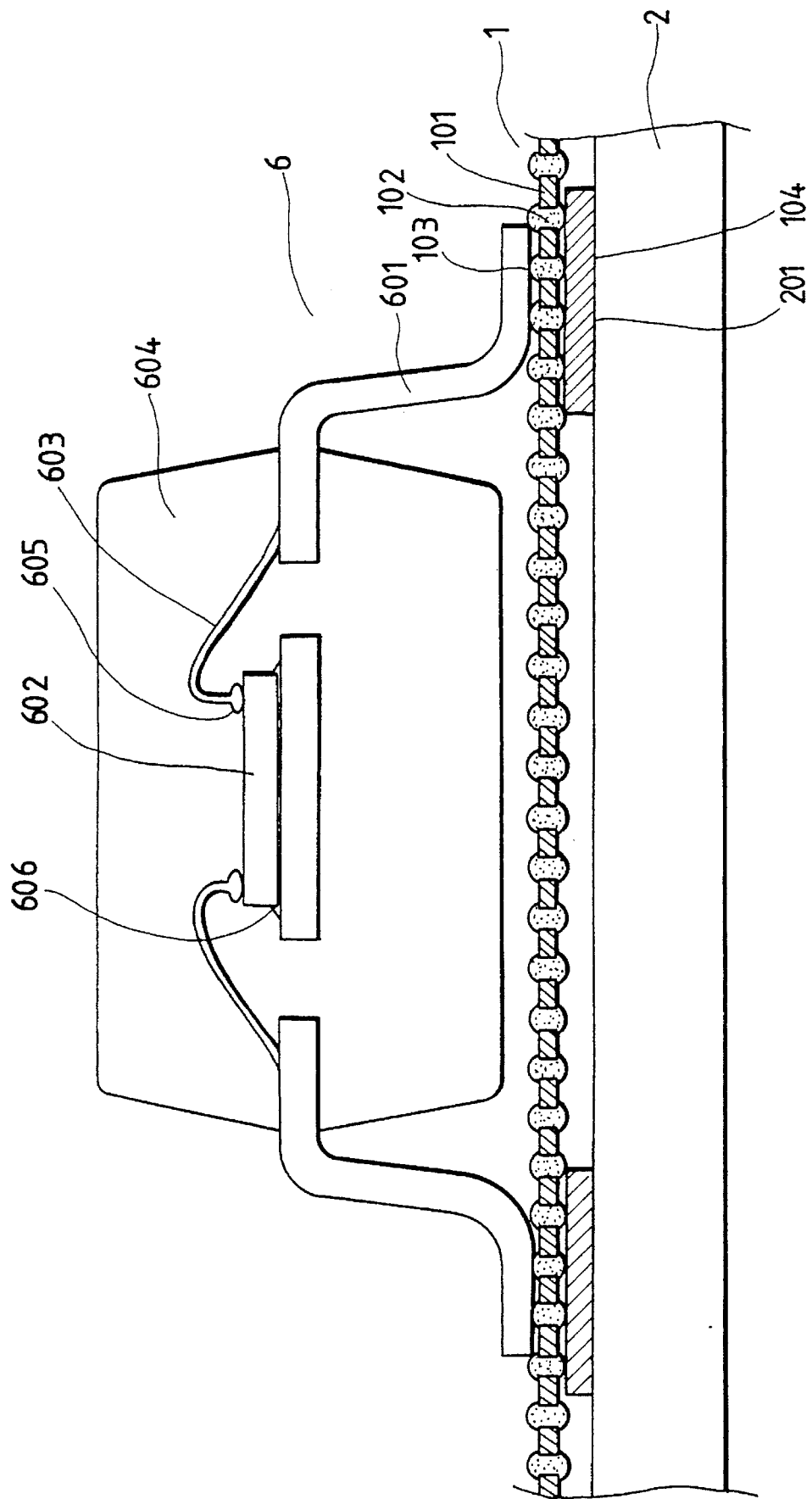
FIG. 4 is a sectional view showing an example in which the present invention is applied, after various elements are connected to each other.

FIG. 4 shows a fifth embodiment of the present invention. FIG. 4 is a schematic sectional view showing a condition that various elements are electrically interconnected. This embodiment is the same as the first embodiment, except that a measured part comprises a semi-conductor part 6.

The semi-conductor part is manufactured by securely adhering a semi-conductor element 602 on a lead frame 601 by means of silver paste 606 and by wire-bonding connection portions 605 to the lead frame 601 by means of gold wires 603 and then by securing these elements with sealing material 604 by the transfer molding technique.

According to this embodiment, it was possible to electrically check 100 or more semi-conductor parts by using the same conductive members included in a desired range. Further, it was possible to check the measured part and the system utilizing such part quickly, cheaply and reliably.

Figure 5:
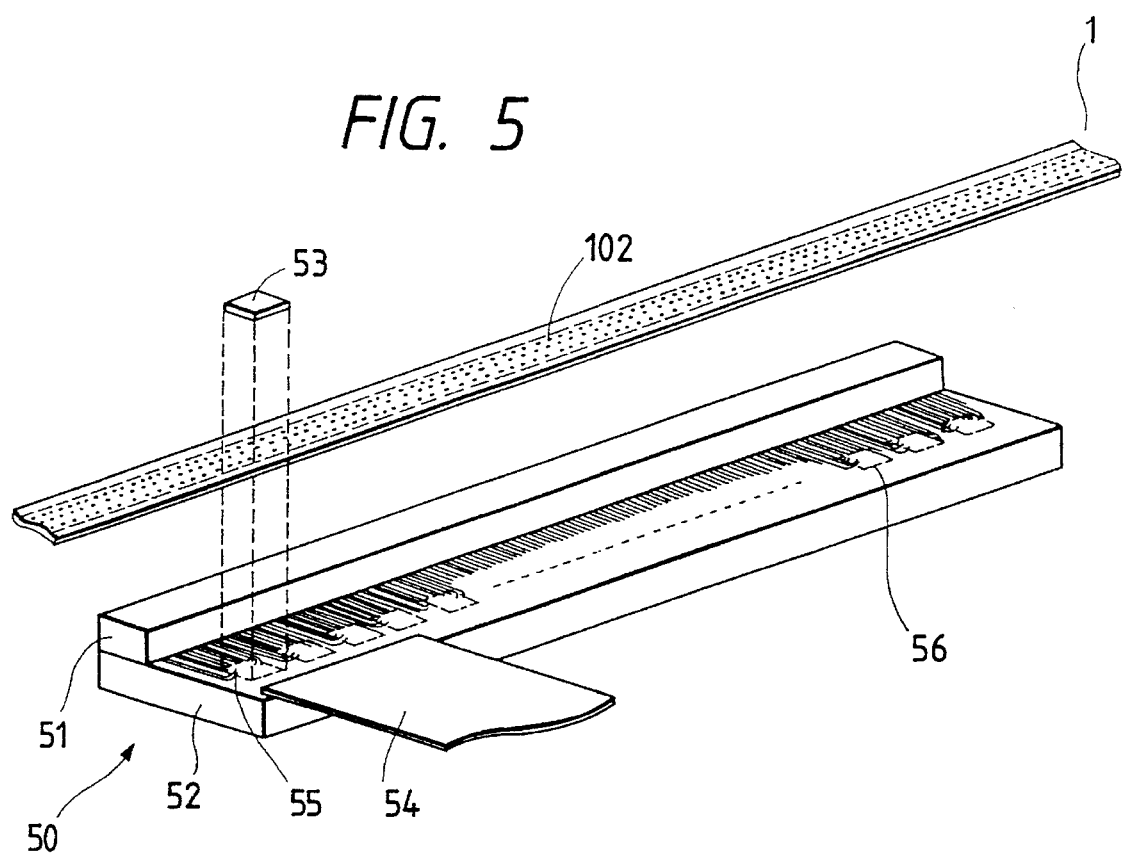
FIGS. 5 to 7 are perspective views other examples in which the present invention is applied, after various elements are connected to each other.

A sixth embodiment of the present invention is shown in FIG. 5. FIG. 5 is a perspective view showing a condition before various elements are electrically interconnected.

Since the electrical connection is the same as that in the first embodiment, the explanation thereof will be omitted. The sixth embodiment relates to a method for checking an ink jet head for discharging ink by utilizing thermal energy.

An ink jet head 50 may be a conventional one which discharges the ink by heating heater bodies in response to external signal. The head comprises a member 51 including a plurality small discharge openings communicated with ink passages, a substrate board 52 wherein a wiring pattern and the heater bodies are disposed on a glass or silicone support, driver ICs 53 for driving the head, and a flexible print wiring plate 54 on which a wiring pattern for inputting the external signal is provided. Since the operation of the head is well-known, the explanation thereof will be omitted.

This embodiment relates to a method for checking the ink jet head 50 before the driver ICs 53 are mounted on the head 50.

In this embodiment, the head 50 is checked by electrically connecting connection portions for the driver ICs 53 to the electrically conductive members 102 of the electric connection member 1 and connection portions 55 of the substrate board 52 to the electrically conductive members 102, respectively, and by discharging the ink from the head in response to the external signal from the flexible print wiring plate 54 regarding the number of driver IC mounting portions 56.

In this embodiment, while the driver ICs are electrically connected and checked one by one, a plurality of driver ICs may be simultaneously connected and checked.

Also in this embodiment, it was possible to check the measured part and the system utilizing such part quickly, cheaply and reliably.

Figure 6:
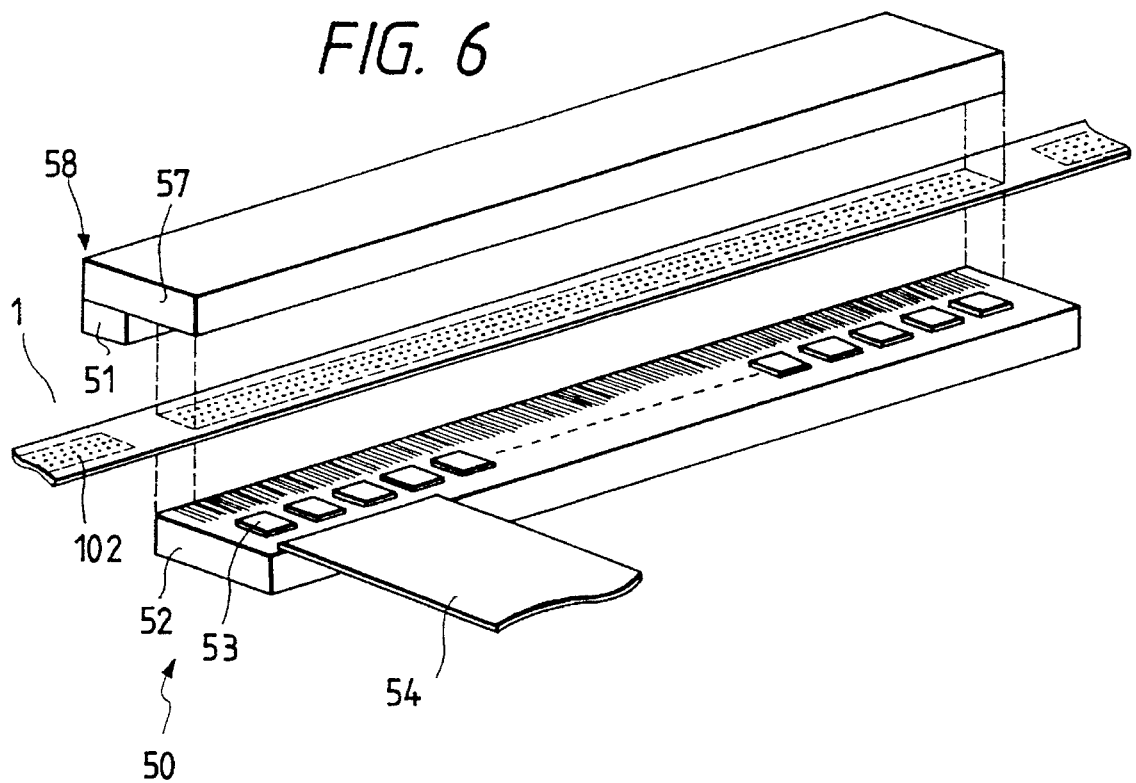

A seventh embodiment of the present invention is shown in FIG. 6.

In this embodiment, a substrate plate 57 on which the member 51 including the ink passages is mounted is separated from the substrate plate 52 on which the driver ICs 53 are mounted, and connection portions are disposed on end portions of the substrate plates.

In this embodiment, the driver ICs 53 are mounted on the substrate plate, an ink jet head portion 58 consisting of the member 51 and the substrate plate 57.

In this embodiment, the electric connection member 1 included groups of electrically conductive members.

Also in this embodiment, it was possible to check the measured part and the system utilizing such part quickly, cheaply and reliably.

Figure 7:
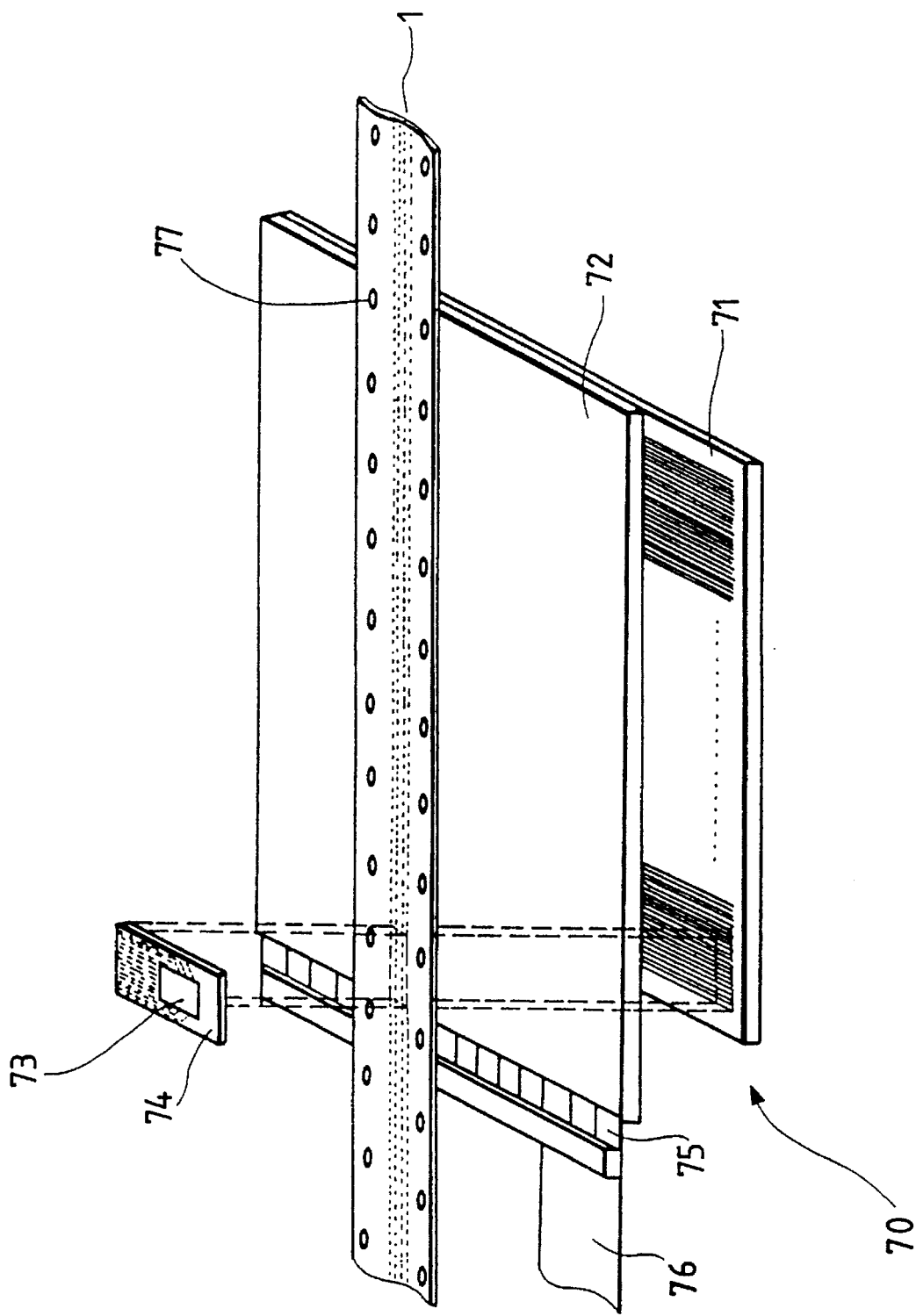
Figure 8A:
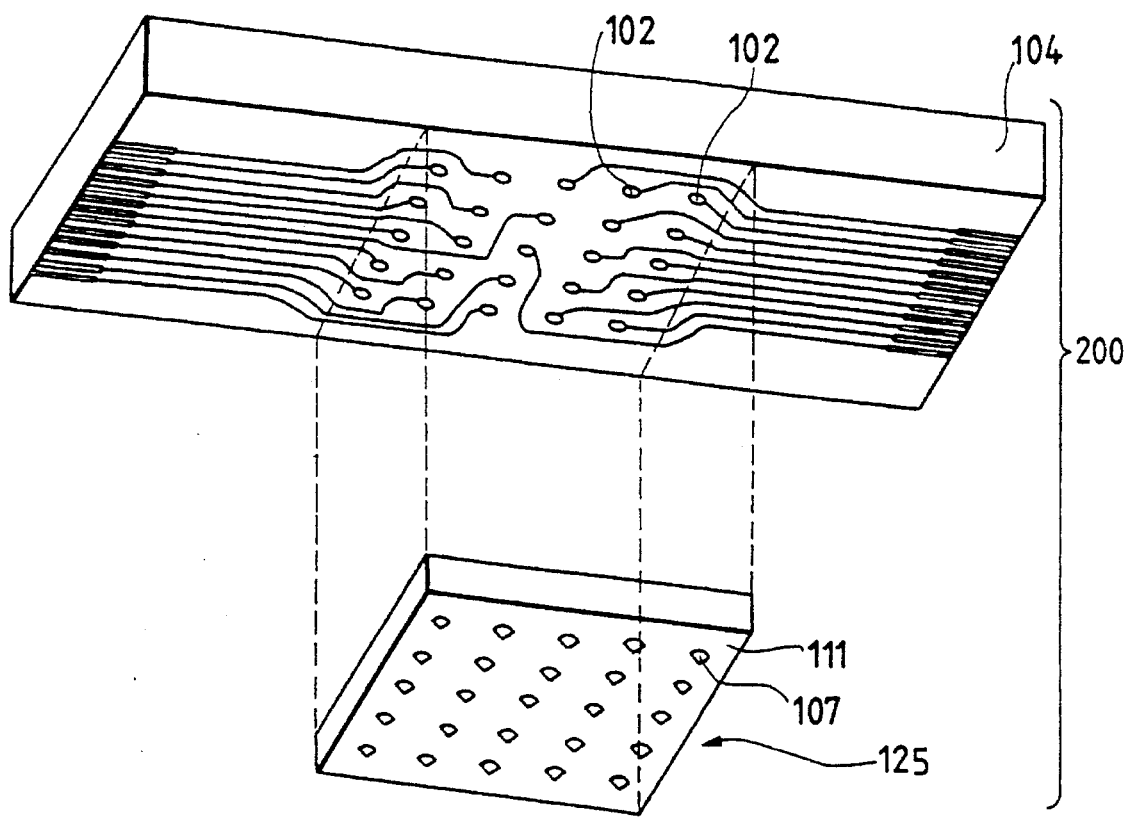
FIGS. 8A to 8C are views showing a conventional checking method.
Figure 8B:
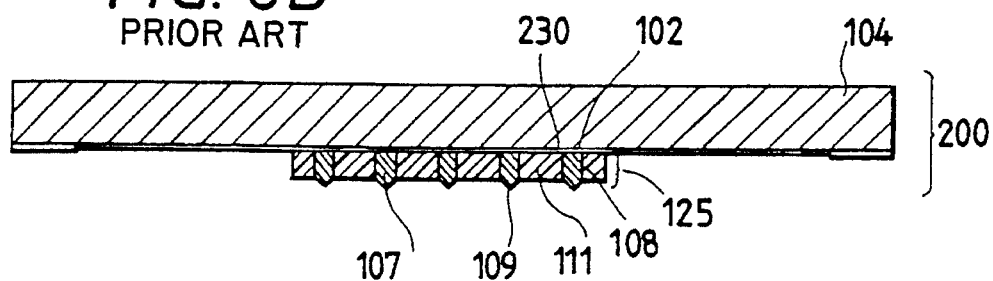
Figure 8C:
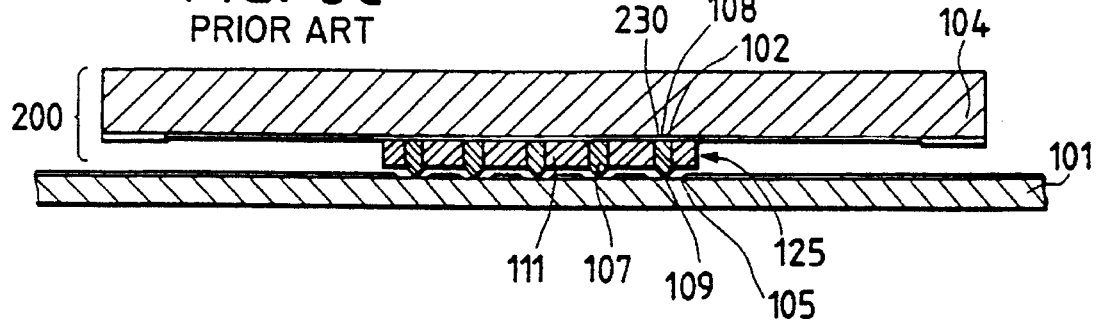

An eighth embodiment of the present invention is shown in FIG. 7. This embodiment relates to a method for checking a liquid crystal display device.

A liquid crystal display device 70 mainly comprises a means for sealing the liquid crystal between two glass substrates 71, 72 on which a wiring pattern (and/or function elements) is disposed, a plurality of TAB tape substrates 74, 75 on which driver ICs 73 are mounted by TAB (Tape Automated Bonding) technique, and a flexible circuit substrate 76 on which a wiring pattern for inputting the external signal is disposed.

In this embodiment, the glass substrate 72 and the TAB tape substrate 74 are urged against each other and removably and electrically connected to each other via the electric connection member.

Since the operation of the liquid crystal display device is well-known, the explanation thereof will be omitted.

In this embodiment, the electric connection member has sprocket holes along its lateral edge portions to facilitate the feeding of the tape as in the third embodiment.

Also in this embodiment, it was possible to check the measured part and the system utilizing such part quickly, cheaply and reliably.

Further, in this embodiment, while the device was measured per desired bits, a plurality of TAB tape substrates 74 arranged side by side may be measured simultaneously or a plurality of TAB tape substrates 75 may be measured simultaneously in the same measuring manner regarding the TAB tape substrates 74.

As mentioned above, according to the present invention, it is possible to measure the multi-pin measured part with narrower pitch than the conventional cases and to check the electric features and/or system features of numerous measured parts by using the electric connection member easily and cheaply.

Since the conductive members of the electric connection member can be shortened, the stray capacity of the electric connection member is small in contrast to the normal electric resistance wirings, thus reducing the delay of the electric signal, with the result that the electric feature and/or system feature can be checked very effectively.

Further, even if there is the dispersion in the protruding amounts of the conductive members in the electric connection member, it is possible to check the part stably and reliably.

When the electrically conductive members of the electric connection member have the desired wiring pattern, it is necessary to correctly position the electric circuit member and the measured part, but the positioning of the electric connection member regarding the electric circuit member and the measured part may be effected roughly. Also, in this case, the same electric connection member can be used with respect to various kinds of measured parts, thus improving the practical use.

Further, when the electric connection member is in the form of feedable roll, the measuring speed can be increased, thus making the method inexpensive.

In addition, when the vibration is added in the checking method, even if the surface of the measured part is apt to be oxidized or if the foreign matters such as dirt and the like are adhered on the measured part, it is possible to check the measured part effectively and reliably.

We claim:

1. A method of measuring a part to be measured using an electric connection member of belt-like construction having a holder made of electrically insulative material and a plurality of electrically conductive members embedded within said holder being insulated from each other, both ends of said electrically conductive members being exposed on both surfaces of said holder in such a manner that the both ends are flush with or protrude from the both surfaces of said holder and an electric circuit member having connection portions, said part to be measured having connection portions; wherein at least one of the ends of said electrically conductive members exposed on one surface of said holder is electrically connected to one of said connection portions of said electric circuit member and at least one of the ends of said electrically conductive members exposed on the other surface of said holder is electrically connected to one of said connection portions of said part to be measured, whereby at least one of an electric feature and system feature of said part to be measured is measured by using said electric circuit member, the method comprising:

a first measuring step for effecting a measurement of the part to be measured by utilizing a first area of said electrically conductive member repeatedly plural times for each part to be measured;

a shifting step for shifting said electrically conductive member relative to said part to be measured and said electric circuit member for utilizing an area of said electric conductive member adjacent to the first area;

a second measuring step for effecting the measurement of said part to be measured by using the area of said electrically conductive member adjacent to the first area used in said first measuring step; and a vibrating step of applying a vibration to said part to be measured to which said electrical connection is effected, before or during the measurements to remove material formed on the surface of electrical contact between the part to be measured and the electrically conductive member.

2. A measuring method according to claim 1, wherein said belt-like electric connection member is rolled and is unwound to be supplied to a measuring area.

3. A measuring method according to claim 1, wherein said electric circuit member is a semi-conductor element, semi-conductor part or circuit board.

4. A measuring method according to claim 1, wherein said measured part is a semi-conductor element, semi-conductor substrate, circuit board, silicone substrate or lead frame.

5. A measuring method according to claim 1, wherein said measured part is an ink jet head for performing a recording operation by discharging ink.

6. A measuring method according to claim 5, wherein said ink jet head discharges the ink by utilizing thermal energy.

7. A measuring method according to claim 1, wherein said electric connection member is in the form of a band, and a process for repeatedly using the same electrically conductive member is repeated with respect to adjacent areas of the electric connection member.

8. Apparatus for measuring a part to be measured comprising:

an electric connection member of belt-like construction including a holder made of electrically insulative material and a plurality of electrically conductive members embedded within said holder being insulated from each other, both ends of said electrically conductive members being exposed on both surfaces of said holder in such a manner that the both ends are flush with or protrude from the both surfaces of said holder, and an electric circuit member having connection portions, said part to be measured having connection portions wherein at least one of the ends of said electrically conductive members exposed on one surface of said holder is electrically connected to one of said connection portions of said electric circuit member and at least one of the ends of said electrically conductive members exposed on the other surface of said holder is electrically connected to one of said connection portions of said part to be measured, whereby at least one of an electrical feature and system feature of said part to be measured is measured by using said electric circuit member;

wherein said electric circuit member performs a first measurement of the parts to be measured; and means for applying vibration to said part to be measured to which said electrical connection is effected, before or during the measurement.

9. The apparatus according to claim 8, further comprising means for rolling and unwinding the belt-like connection member to be supplied to a measuring area.

10. The apparatus of claim 8, wherein said electric circuit member is a semi-conductor element, semi-conductor part or circuit board.

11. The apparatus of claim 8, wherein said measured part is a semi-conductor element, semi-conductor substrate, circuit board, silicon substrate or lead frame.

12. The apparatus of claim 8, wherein said measured part is an ink Jet head for performing a recording operation by discharging ink.

13. The apparatus of claim 12, wherein said ink jet head discharges the ink by utilizing thermal energy.

14. The apparatus of claim 9, wherein said electric circuit member performs said first measurement repeatedly using a first area of said electrical conductive member; and said apparatus further comprises:

means for shifting said electrically conductive member relative to said part to be measured and said electrical circuit member to a second area of said electrical conductive member adjacent to the first area; and said electric circuit means further including means for performing a second measurement of said parts to be measured utilizing the second area of said electrical conductive member.

15. The apparatus of claim 14, wherein said electric connection member is in the form of a band, and the measurements repeatedly using the same electrically conductive member are repeated with respect to adjacent areas of the electric connection member.

* * * * *

UNITED STATES PATENT AND TRADEMARK OFFICE
CERTIFICATE OF CORRECTION

PATENT NO. : 5,521,520

DATED : May 28, 1996

INVENTORS : TESTUO YOSHIZAWA ET AL.

It is certified that error appears in the above-identified patent and that said Letters Patent is hereby corrected as shown below:

ON THE TITLE PAGE

[56] References Cited -Foreign Patent Documents

```
"0291167  11/1989 Japan
 1302172  12/1989 Japan" should read
--1-291167  11/1989 Japan
  1-302172  12/1989 Japan--.

"2239744  10/1991 United Kingdom" should read
--2239744  7/1991 United Kingdom--.
```

COLUMN 2

```
Line 8,   "109," should read --109, and--;
Line 15,  Delete "By the way, the inventors and the like
          has" and insert --It has been--.
```

COLUMN 4

```
Line 60,  "views" should read --views showing--.
```

UNITED STATES PATENT AND TRADEMARK OFFICE
CERTIFICATE OF CORRECTION

PATENT NO. : 5,521,520

DATED : May 28, 1996

INVENTORS : TESTUO YOSHIZAWA ET AL.

It is certified that error appears in the above-identified patent and that said Letters Patent is hereby corrected as shown below:

COLUMN 6

Line 49,  "like." should read --like can be used.--.

COLUMN 9

Line 8,   "plurality" should read --plurality of--.

COLUMN 12

Line 25,  "Jet" should read --jets;
  Line 29,  "claim 9, " should read --claim 8,--;

UNITED STATES PATENT AND TRADEMARK OFFICE
CERTIFICATE OF CORRECTION

PATENT NO. : 5,521,520

DATED : May 28, 1996

INVENTORS : TESTUO YOSHIZAWA ET AL.

It is certified that error appears in the above-identified patent and that said Letters Patent is hereby corrected as shown below:

COLUMN 12

Line 38, "said electric circuit means further including means for" should read --wherein said electric circuit member further performs--;

Line 39, "performing" should be deleted.

Signed and Sealed this

Twenty-fourth Day of September, 1996

Attest:

BRUCE LEHMAN

Attesting Officer      Commissioner of Patents and Trademarks